(12) United States Patent
Ren et al.

(10) Patent No.: US 9,299,605 B2
(45) Date of Patent: Mar. 29, 2016

(54) METHODS FOR FORMING PASSIVATION PROTECTION FOR AN INTERCONNECTION STRUCTURE

(71) Applicant: Applied Materials, Inc., Santa Clara, CA (US)

(72) Inventors: He Ren, San Jose, CA (US); Mehul B. Naik, San Jose, CA (US); Yong Cao, San Jose, CA (US); Sree Rangasai V. Kesapragada, Milpitas, CA (US); Mei-Yee Shek, Palo Alto, CA (US); Yana Cheng, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 56 days.

(21) Appl. No.: 14/201,728

(22) Filed: Mar. 7, 2014

(65) Prior Publication Data
US 2015/0255329 A1  Sep. 10, 2015

(51) Int. Cl.
*H01L 21/02*  (2006.01)
*H01L 21/768*  (2006.01)

(52) U.S. Cl.
CPC ...... *H01L 21/76841* (2013.01); *H01L 21/0217* (2013.01); *H01L 21/02126* (2013.01); *H01L 21/02167* (2013.01); *H01L 21/02266* (2013.01); *H01L 21/76829* (2013.01)

(58) Field of Classification Search
CPC .................. H01L 21/0217; H01L 21/6841
USPC ................................. 257/211, 751; 438/672
See application file for complete search history.

(56) References Cited

U.S. PATENT DOCUMENTS

| | | | |
|---|---|---|---|
| 5,626,775 A | 5/1997 | Roberts et al. | |
| 6,518,167 B1* | 2/2003 | You et al. | 438/622 |
| 6,613,682 B1 | 9/2003 | Jain et al. | |
| 6,617,244 B2 | 9/2003 | Nishizawa | |
| 7,074,708 B2* | 7/2006 | Gaillard et al. | 438/623 |
| 7,205,223 B2* | 4/2007 | McTeer | 438/622 |
| 7,563,704 B2* | 7/2009 | Yang et al. | 438/622 |
| 7,691,749 B2 | 4/2010 | Levy et al. | |
| 2004/0072440 A1 | 4/2004 | Kim et al. | |
| 2005/0026431 A1 | 2/2005 | Kazumi et al. | |
| 2008/0113516 A1 | 5/2008 | Takeshita et al. | |
| 2008/0145998 A1 | 6/2008 | Delgadino et al. | |
| 2009/0085173 A1 | 4/2009 | Boemmels et al. | |
| 2010/0200993 A1 | 8/2010 | Cui et al. | |
| 2013/0034968 A1 | 2/2013 | Zhang et al. | |

* cited by examiner

*Primary Examiner* — Matthew W Such
*Assistant Examiner* — Warren H Kilpatrick
(74) *Attorney, Agent, or Firm* — Patterson & Sheridan, LLP (57) ABSTRACT

Methods for forming a passivation protection structure on a metal line layer formed in an insulating material in an interconnection structure are provided. In one embodiment, a method for forming passivation protection on a metal line in an interconnection structure for semiconductor devices includes selectively forming a metal capping layer on a metal line bounded by a dielectric bulk insulating layer in an interconnection structure formed on a substrate in a processing chamber incorporated in a multi-chamber processing system, in-situ forming a barrier layer on the substrate in the processing chamber; wherein the barrier layer is a metal dielectric layer, and forming a dielectric capping layer on the barrier layer in the multi-chamber processing system.

20 Claims, 3 Drawing Sheets

METHODS FOR FORMING PASSIVATION PROTECTION FOR AN INTERCONNECTION STRUCTURE

BACKGROUND OF THE INVENTION

1. Field of the Invention

Embodiments of the present invention generally relate to methods for forming passivation protection for an interconnection structure. More particularly, embodiments of the present invention generally relate to methods for forming passivation protection for an interconnection structure for semiconductor devices to prevent excess oxidation.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used during etching structures, such as gate structure, shallow trench isolation (STI), bit lines and the like, or back end dual damascene structure on a substrate. The patterned mask is conventionally fabricated by using a lithographic process to optically transfer a pattern having the desired critical dimensions to a layer of photoresist. The photoresist layer is then developed to remove undesired portions of the photoresist, thereby creating openings in the remaining photoresist.

As the dimensions of the integrated circuit components are reduced (e.g., to deep sub-micron dimensions), the materials used to fabricate such components must be carefully selected in order to obtain satisfactory levels of electrical performance. For example, when the distance between adjacent metal interconnects and/or the thickness of the dielectric bulk insulating material that isolates interconnects having sub-micron dimensions, the potential for capacitive coupling occurs between the metal interconnects is high. Capacitive coupling between adjacent metal interconnects may cause cross talk and/or resistance-capacitance (RC) delay which degrades the overall performance of the integrated circuit and may render the circuit inoperable. In order to minimize capacitive coupling between adjacent metal interconnects, low dielectric constant bulk insulating materials (e.g., dielectric constants less than about 4.0) are needed. Examples of low dielectric constant bulk insulating materials include silicon dioxide ($SiO_2$), silicate glass, fluorosilicate glass (FSG), and carbon doped silicon oxide (SiOC), among others.

During the semiconductor manufacturing process, after a metal CMP process, the underlying upper surface of the metal line formed from the dielectric bulk insulating materials is exposed to air. Prior to the subsequent metallization process to form interconnection on the exposed metal, the substrate may be transferred among different vacuum environments to perform a different processing steps. During transfer, the substrate may have to reside outside the process chamber or controlled environment for a period of time called the queue time (Q-time). During the Q-time, the substrate is exposed to ambient environmental conditions that include oxygen and water at atmospheric pressure and room temperature. As a result, the substrate subjected to oxidizing conditions in the ambient environment may accumulate native oxides or contaminants on the metal surface prior to the subsequent metallization process or interconnection fabrication process.

Generally, longer Q-times allow thicker oxide layers to form. Excess native oxide accumulation or contaminants may adversely affect the nucleation capability of the metal elements to adhere to the substrate surface during a subsequently metallization process. Furthermore, poor adhesion at the interface may also result in undesired high contact resistance, thereby resulting in undesirably poor electrical properties of the device. In addition, poor nucleation of the metal elements in the back end interconnection may impact not only the electrical performance of the devices, but also on the integration of the conductive contact material subsequently formed thereon.

Recently, a metal containing passivation layer is utilized to cover the exposed surface of a metal line formed in interconnects from the dielectric bulk insulating materials. The metal containing passivation layer may minimize exposure of the metal line from the interconnect material to atmosphere/air so as to prevent damage to the semiconductor device. Furthermore, materials selected to fabricate the metal containing passivation layer are often required to provide certain desired degree of conductivity as well as high moisture/contamination resistance so as to serve as a good passivation protection at the interface as well as maintaining low resistivity at the interconnection interface. By utilizing this metal containing passivation layer formed on the metal line, exposure to the air/atmosphere may be minimized. However, in some cases, inadequate selection or utilization of the metal containing passivation layer may result in insufficient moisture or diffusion resistance, or film degradation during the subsequent plasma process, thereby eventually leading to device failure.

Thus, there is a need for improved methods to form an interconnection passivation protection structure with good interface quality control for metal exposure with minimum substrate oxidation.

SUMMARY

Methods for forming a passivation protection structure on a metal line layer formed in an insulating material in an interconnection structure are provided. In one embodiment, a method for forming passivation protection on a metal line in an interconnection structure for semiconductor devices includes selectively forming a metal capping layer on a metal line bounded by a dielectric bulk insulating layer in an interconnection structure formed on a substrate in a processing chamber incorporated in a multi-chamber processing system, in-situ forming a barrier layer on the substrate in the processing chamber; wherein the barrier layer is a metal dielectric layer, and forming a dielectric capping layer on the barrier layer in the multi-chamber processing system.

In another embodiment, a method for forming passivation protection on a metal line in an interconnection structure for semiconductor devices includes selectively forming a metal capping layer on a metal line bounded by a dielectric bulk insulating layer in an interconnection structure formed on a substrate in a PVD processing chamber, in-situ forming a barrier layer on the substrate in the PVD processing chamber; wherein the barrier layer is a metal dielectric layer, and forming a dielectric capping layer on the barrier layer.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for forming a passivation protection structure on a metal line layer formed in an insulating material in a semiconductor device are provided. The passivation protection structure formed on the metal line may efficiently protect the metal line from exposure to the atmosphere, thereby substantially eliminating the likelihood of native oxide formation or contamination, and maintaining a good interface control. In one embodiment, the passivation protection structure may include at least one layer fabricated from a metal containing layer. The passivation protection structure may be a single layer, stack layer with multiple layers, a single or multiple layer stacks with a treatment layer formed thereon. By utilizing a proper passivation protection structure formed on a metal line, the metal line may be maintained with minimum oxide or contamination generation, thereby increasing manufacturing flexibility without degradation of device performance.

Figure 1:
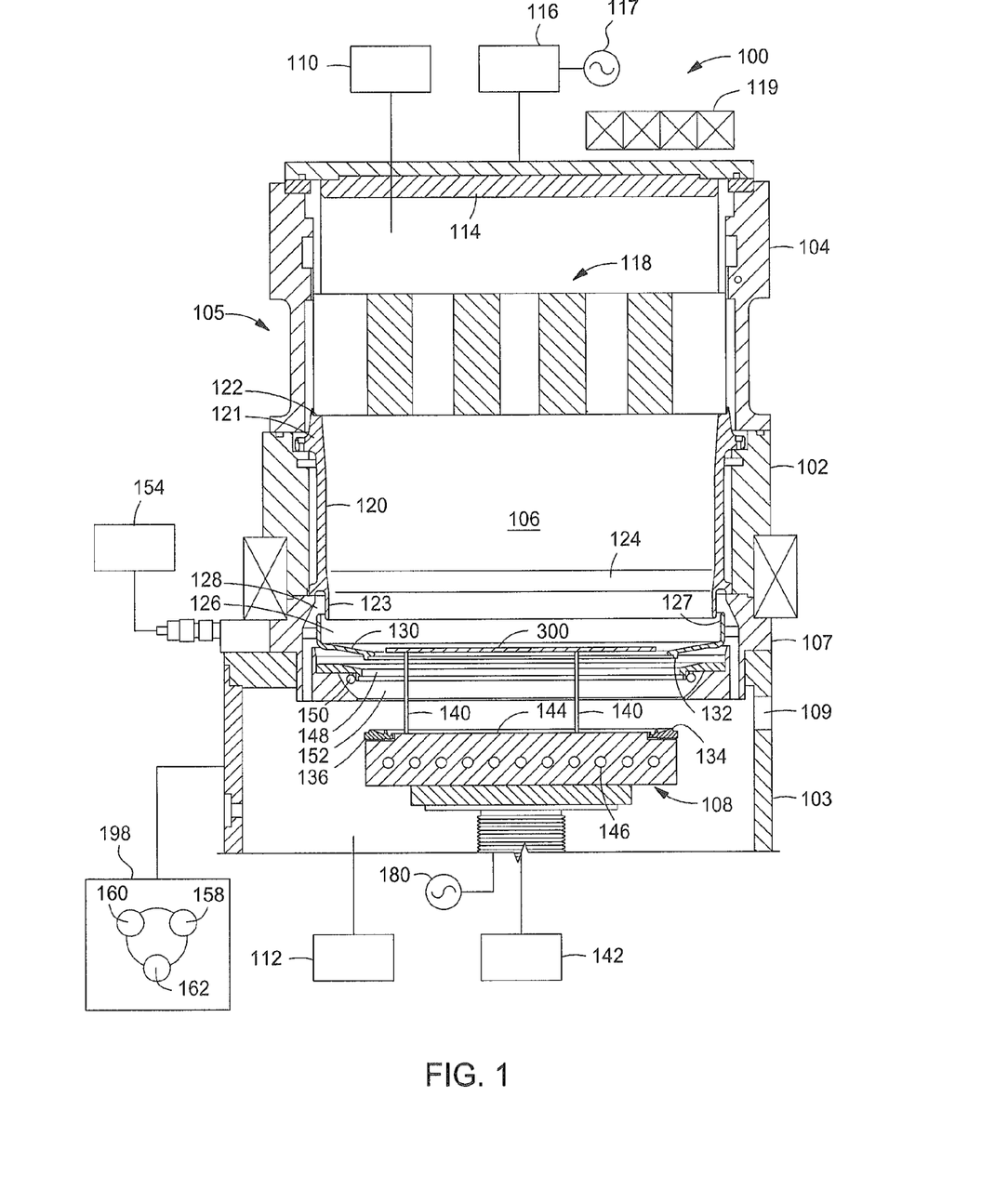
FIG. 1 depicts a schematic cross-sectional view of one embodiment of a process chamber in accordance with the invention.

FIG. 1 illustrates an exemplary physical vapor deposition (PVD) chamber 100 (e.g., a sputter process chamber) suitable for sputter depositing materials according to one embodiment of the invention. Examples of suitable PVD chambers include the ALPS® Plus and SIP ENCORE® PVD processing chambers, both commercially available from Applied Materials, Inc., Santa Clara, of California. It is contemplated that processing chambers available from other manufactures may also be adapted to perform the embodiments described herein.

FIG. 1 is a schematic cross-sectional view of a deposition chamber 100 according to one embodiment. The deposition chamber 100 has an upper sidewall 102, a lower sidewall 103, and a lid portion 104 defining a body 105 that encloses an interior volume 106 thereof. An adapter plate 107 may be disposed between the upper sidewall 102 and the lower sidewall 103. A substrate support, such as a pedestal 108, is disposed in the interior volume 106 of the deposition chamber 100. A substrate transfer port 109 is formed in the lower sidewall 103 for transferring substrates into and out of the interior volume 106.

In one embodiment, the deposition chamber 100 comprises a sputtering chamber, also known as a physical vapor deposition (PVD) chamber, capable of depositing, for example, titanium, aluminum oxide, aluminum, aluminum nitride, aluminum oxynitride, copper, tantalum, tantalum nitride, tantalum oxynitride, titanium oxynitride, tungsten, or tungsten nitride on a substrate, such as the substrate 300.

A gas source 110 is coupled to the deposition chamber 100 to supply process gases into the interior volume 106. In one embodiment, process gases may include inert gases, non-reactive gases, and reactive gases if necessary. Examples of process gases that may be provided by the gas source 110 include, but not limited to, argon gas (Ar), helium (He), neon gas (Ne), nitrogen gas ($N_2$), oxygen gas ($O_2$), and $H_2O$ among others.

A pumping device 112 is coupled to the deposition chamber 100 in communication with the interior volume 106 to control the pressure of the interior volume 106. In one embodiment, the pressure level of the deposition chamber 100 may be maintained at about 1 Torr or less. In another embodiment, the pressure level of the deposition chamber 100 may be maintained at about 500 milliTorr or less. In yet another embodiment, the pressure level of the deposition chamber 100 may be maintained at about 1 milliTorr and about 300 milliTorr.

The lid portion 104 may support a sputtering source 114, such as a target. In one embodiment, the sputtering source 114 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In an exemplary embodiment depicted herein, the sputtering source 114 may be fabricated by titanium (Ti) metal, tantalum metal (Ta) or aluminum (Al).

The sputtering source 114 may be coupled to a source power assembly 116 comprising a power supply 117 for the sputtering source 114. A set of magnets 119 may be coupled adjacent to the sputtering source 114 which enhances efficient sputtering materials from the sputtering source 114 during processing. Examples of the magnetron assembly include an electromagnetic linear magnetron, a serpentine magnetron, a spiral magnetron, a double-digitated magnetron, a rectangularized spiral magnetron, among others.

An additional RF power source 180 may also coupled to the deposition chamber 100 through the pedestal 108 to provide a bias power between the sputtering source 114 and the pedestal 108 as needed. In one embodiment, the RF power source 180 may have a frequency between about 1 MHz and about 100 MHz, such as about 13.56 MHz.

A collimator 118 may be positioned in the interior volume 106 between the sputtering source 114 and the pedestal 108. A shield tube 120 may be in proximity to the collimator 118 and interior of the lid portion 104. The collimator 118 includes a plurality of apertures to direct gas and/or material flux within the interior volume 106. The collimator 118 may be mechanically and electrically coupled to the shield tube 120. In one embodiment, the collimator 118 is mechanically coupled to the shield tube 120, such as by a welding process, making the collimator 118 integral to the shield tube 120. In another embodiment, the collimator 118 may be electrically floating within the chamber 100. In another embodiment, the collimator 118 may be coupled to an electrical power source and/or electrically coupled to the lid portion 104 of the body 105 of the deposition chamber 100.

The shield tube 120 may include a tubular body 121 having a recess 122 formed in an upper surface thereof. The recess 122 provides a mating interface with a lower surface of the collimator 118. The tubular body 121 of the shield tube 120 may include a shoulder region 123 having an inner diameter that is less than the inner diameter of the remainder of the tubular body 121. In one embodiment, the inner surface of the tubular body 121 transitions radially inward along a tapered surface 124 to an inner surface of the shoulder region 123. A shield ring 126 may be disposed in the chamber 100 adjacent to the shield tube 120 and intermediate of the shield tube 120 and the adapter plate 107. The shield ring 126 may be at least partially disposed in a recess 128 formed by an opposing side of the shoulder region 123 of the shield tube 120 and an interior sidewall of the adapter plate 107.

In one aspect, the shield ring 126 includes an axially projecting annular sidewall 127 that includes an inner diameter that is greater than an outer diameter of the shoulder region 123 of the shield tube 120. A radial flange 130 extends from the annular sidewall 127. The radial flange 130 may be formed at an angle greater than about ninety degrees (90°) relative to the inside diameter surface of the annular sidewall 127 of the shield ring 126. The radial flange 130 includes a protrusion 132 formed on a lower surface thereof. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recessed flange 134 formed in an edge ring 136 disposed on the pedestal 108. The recessed flange 134 may be a circular groove formed in the edge ring 136. The engagement of the protrusion 132 and the recessed flange 134 centers the shield ring 126 with respect to the longitudinal axis of the pedestal 108. The substrate 300 (shown supported on lift pins 140) is centered relative to the longitudinal axis of the pedestal 108 by coordinated positioning calibration between the pedestal 108 and a robot blade (not shown). In this manner, the substrate 300 may be centered within the deposition chamber 100 and the shield ring 126 may be centered radially about the substrate 300 during processing.

In operation, a robot blade (not shown) having a substrate 300 thereon is extended through the substrate transfer port 109. The pedestal 108 may be lowered to allow the substrate 300 to be transferred to the lift pins 140 extending from the pedestal 108. Lifting and lowering of the pedestal 108 and/or the lift pins 140 may be controlled by a drive 142 coupled to the pedestal 108. The substrate 300 may be lowered onto a substrate receiving surface 144 of the pedestal 108. With the substrate 300 positioned on the substrate receiving surface 144 of the pedestal 108, sputter deposition may be performed on the substrate 300. The edge ring 136 may be electrically insulated from the substrate 300 during processing. Therefore, the substrate receiving surface 144 may include a height that is greater than a height of portions of the edge ring 136 adjacent the substrate 300 such that the substrate 300 is prevented from contacting the edge ring 136. During sputter deposition, the temperature of the substrate 300 may be controlled by utilizing thermal control channels 146 disposed in the pedestal 108.

After sputter deposition, the substrate 300 may be elevated utilizing the lift pins 140 to a position that is spaced away from the pedestal 108. The elevated location may be proximate one or both of the shield ring 126 and a reflector ring 148 adjacent to the adapter plate 107. The adapter plate 107 includes one or more lamps 150 coupled thereto intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 300 to heat the substrate 300 and the material deposited thereon. Reflective surfaces on the chamber components surrounding the substrate 300 serve to focus the energy toward the backside of the substrate 300 and away from other chamber components where the energy would be lost and/or not utilized. The adapter plate 107 may be coupled to a coolant source 154 to control the temperature of the adapter plate 107 during heating.

After heating the substrate 300 to the desired temperature, the substrate 300 is lowered to a position on the substrate receiving surface 144 of the pedestal 108. The substrate 300 may be rapidly cooled utilizing the thermal control channels 146 in the pedestal 108 via conduction. The temperature of the substrate 300 may be ramped down from the first temperature to a second temperature in a matter of seconds to about a minute. The substrate 300 may be removed from the deposition chamber 100 through the substrate transfer port 109 for further processing. The substrate 300 may be maintained at a desired temperature range, such as less than 250 degrees Celsius as needed.

A controller 198 is coupled to the process chamber 100. The controller 198 includes a central processing unit (CPU) 160, a memory 158, and support circuits 162. The controller 198 is utilized to control the process sequence, regulating the gas flows from the gas source 110 into the deposition chamber 100 and controlling ion bombardment of the sputtering source 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU 160 into a specific purpose computer (controller) 198 that controls the deposition chamber 100 such that the processes are performed in accordance with the present invention. The software routines may also be stored and/or executed by a second controller (not shown) that is located remotely from the chamber 100.

During processing, material is sputtered from the sputtering source 114 and deposited on the surface of the substrate 300. The sputtering source 114 and the substrate support pedestal 108 are biased relative to each other by the power supply 117 or 180 to maintain a plasma formed from the process gases supplied by the gas source 110. The ions from the plasma are accelerated toward and strike the sputtering source 114, causing target material to be dislodged from the sputtering source 114. The dislodged target material and process gases forms a layer on the substrate 300 with desired compositions.

Figure 2:
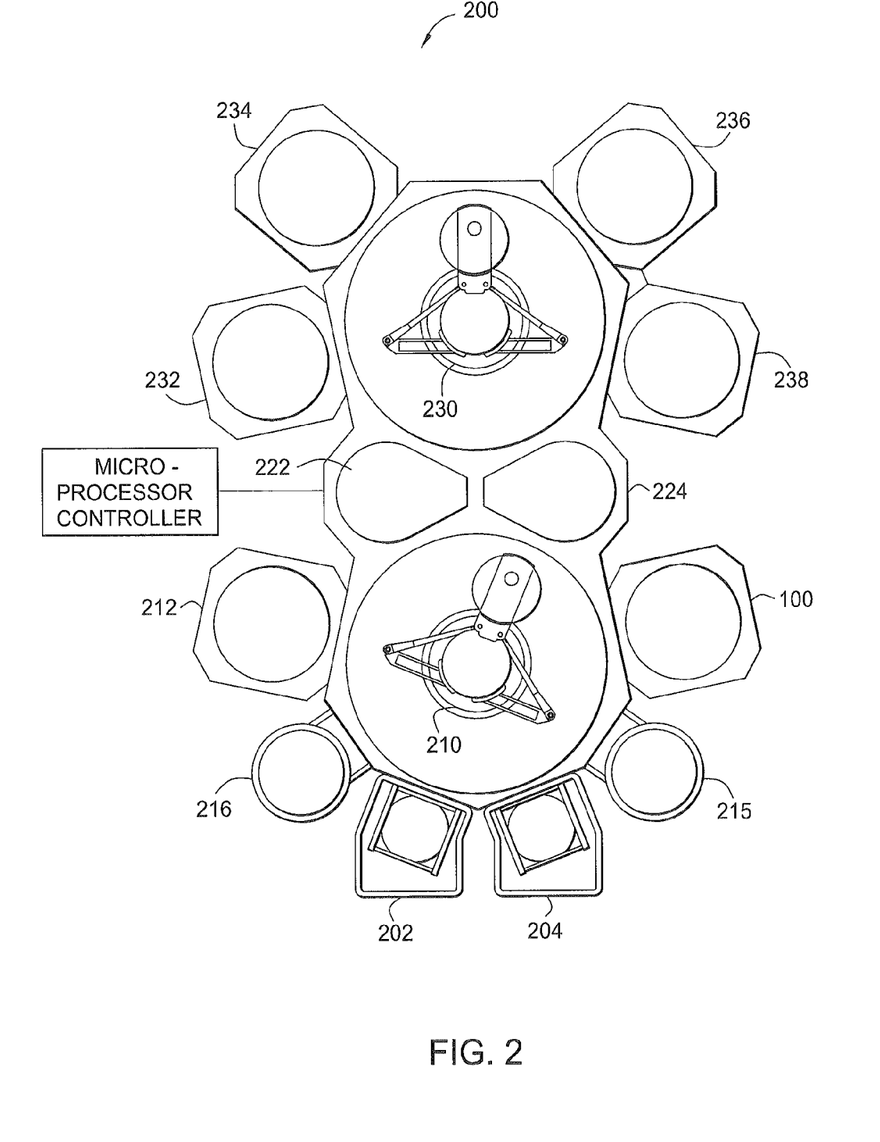
FIG. 2 depicts a schematic top-view diagram of an illustrative multi-chamber processing system.

FIG. 2 is a schematic top-view diagram of an illustrative multi-chamber processing system 200 that can be adapted to perform processes as disclosed herein having the processing chamber 100 coupled thereto. The system 200 can include one or more load lock chambers 202, 204 for transferring substrates into and out of the system 200. Typically, since the system 200 is under vacuum, the load lock chambers 202, 204 can "pump down" the substrates being introduced into the system 200. A first robot 210 can transfer the substrates between the load lock chambers 202, 204, and a first set of one or more substrate processing chambers 212, 214, 215, 100 (four are shown). Each processing chamber 212, 216, 215, 100 is configured to perform at least one of substrate processing operation, such as an etching process, cyclical layer deposition (CLD), atomic layer deposition (ALD), chemical vapor deposition (CVD), physical vapor deposition (PVD), degas, pre-cleaning, orientation and other substrate processes. The position of the processing chamber 100 utilized to perform the etching process relative to the other chambers 212, 216, 215 is for illustration, and the position of the processing chamber 100 may be optionally be switched with any one of the processing chambers 212, 216, 215 if desired.

The first robot 210 can also transfer substrates to/from one or more transfer chambers 222, 224. The transfer chambers 222, 224 can be used to maintain ultra-high vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 216, 215, 100, the processing chambers 232, 234, 236, 238 can be outfitted to perform a variety of substrate processing operations including the dry etch processes described herein any other suitable process including deposition, pre-clean, degas, and orientation, for example. Any of the substrate processing chambers 212, 215, 216, 100, 232, 234, 236, 238 can be removed from the system 200 if not necessary for a particular process to be performed by the system 200.

Figure 3A:
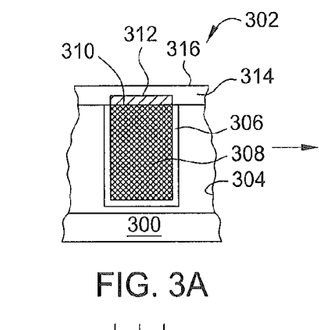
FIGS. 3A-3C depict cross-sectional views of a passivation protection structure disposed on a semiconductor substrate over a sequence processing steps after a metal line is exposed in accordance with one embodiment of the present invention.
Figure 3B:
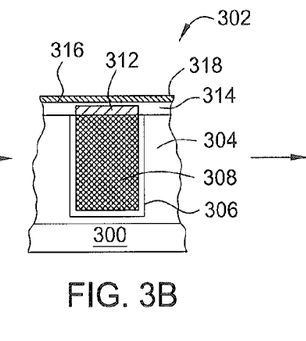
Figure 3C:
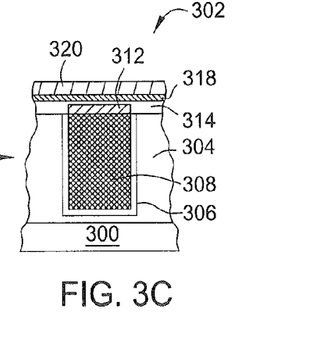

FIG. 3A-3C illustrates cross sectional view of a substrate 300 in different fabrication stages of a passivation protection structure disposed on the substrate 300 forming an interconnection structure 302. The substrate 300 may have a substantially planar surface, an uneven surface, or a substantially planar surface having a structure formed thereon. The substrate 300 shown in FIG. 3A includes an interconnection structure 302, such as a dual damascene structure, a contact interconnection structure or the like, formed on the substrate 300. In one embodiment, the substrate 300 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 300 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In one embodiment, the interconnection structure 302 is an interconnection structure utilized in the contact metal or back end semiconductor process. The interconnection structure 302 includes a dielectric bulk insulating layer 304 having at least one metal layer 308, such as copper line, disposed therein laterally bounded by a barrier layer 306 formed in the dielectric bulk insulating 304. In one embodiment, the dielectric bulk insulating layer 304 is a dielectric material having a dielectric constant less than 4.0 (e.g., a low-k material). Examples of suitable materials include carbon-containing silicon oxides (SiOC), such as BLACK DIAMOND® dielectric material available from Applied Materials, Inc., and other low-k polymers, such as polyamides. In the embodiment depicted in FIG. 3A-3C, the dielectric bulk insulating layer 304 is a carbon-containing silicon oxide (SiOC) layer.

The barrier layer 306 is formed to prevent metal diffusion from the conductive metal layer 308 to the nearby surrounding dielectric bulk insulating layer 304. Thus, the barrier layer 306 is selected to have good barrier properties to block ion diffusion therethrough during the subsequent thermal cycles and processes. In one embodiment, the barrier layer 306 is fabricated by a metal containing layer, such as TaN, TiN, TaON, TiON, Ti, Ta, Co containing materials, Ru containing materials, Mn containing materials and the like. In the embodiment depicted herein, the barrier layer 306 is a TaN layer.

The metal layer 308 formed in the dielectric bulk insulating layer 304 is a conductive material, such as copper, aluminum, tungsten, cobalt, nickel, or other suitable materials. In the embodiment depicted in FIGS. 3A-3C, the metal layer 308 is a copper layer.

After the metal layer 308 is formed in the dielectric bulk insulating layer 304 with a planar surface (e.g., often after a chemical mechanical polishing (CMP) process), a metal capping layer 312 may be formed on an exposed upper surface 310 of the metal layer 308. The metal capping layer 312 may seal the exposed upper surface 310 to reduce likelihood of the metal layer 308 being oxidized or contaminated once it is exposed. The metal capping layer 312 is selected to be fabricated from a material having a relatively good oxidation resistance (i.e., as compared to the material of the metal layer 308) and good metal conductivity to maintain a desired range of contact resistivity. In one embodiment, the metal capping layer 312 may be cobalt containing materials, tungsten containing materials, nickel containing materials, aluminum containing materials, ruthenium containing materials, or manganese containing materials. In one embodiment, the metal capping layer 312 is a cobalt containing layer. It is noted that the metal capping layer 312 may only be selectively formed on the exposed upper surface 310 of the metal layer 308. Alternatively, the metal capping layer 312 may be formed in the entire surface of the substrate 300, including above the metal layer 308 and the dielectric bulk insulating layer 304.

After the metal capping layer 312 is formed on the metal layer 308, a barrier layer 314 is then formed on the metal capping layer 312. The barrier layer 314 may assist covering both the metal capping layer 312 and the metal layer 308 and prevent them from oxidizing, which may adversely deteriorate electrical property of the device. In one embodiment, the barrier layer 314 formed on the substrate 300 may be a metal dielectric layer that can provide good moisture resistance as well as desired electrical properties. Suitable examples of the barrier layer 314 include metal containing layers, such as aluminum containing materials including AlN, $AlO_3$, AlON and the like, metal nitride layers or metal oxide layers. In one embodiment, the barrier layer 314 is a AlN layer with a thickness between about 10 Å and about 100 Å. The barrier layer 314 may also serve as a base layer for another set of interconnection structures to be formed thereon.

It is noted that the metal capping layer 312 and the barrier layer 314 may both be formed in one PVD chamber, such as the chamber 100 depicted in FIG. 1 without breaking vacuum and atmosphere exposure. Alternatively, the metal capping layer 312 and the barrier layer 314 may be formed in one or more different processing chambers, all of which are integrated and incorporated in a single vacuum processing system, such as a cluster system, for example, the multi-chamber processing system 200 depicted in FIG. 2, so as to consecutively form the metal capping layer 312 and the barrier layer 314 without breaking vacuum and exposing the substrate 300 to an ambient atmosphere. The metal capping layer 312 and the barrier layer 314 may also be formed in any processing chamber in the same or different processing platform or system.

After the barrier layer 314 is formed on the substrate 300, a treatment process is then performed to treat the barrier layer 314, forming a treated layer 318 on the barrier layer 314. The treatment process is performed to treat a surface 316 of the barrier layer 314 to alter the surface properties and convert the upper portion of the barrier layer 314 to form the treated layer 318 on the barrier layer 314. The treatment process may be performed in the processing chamber, such as the processing chamber 100 depicted in FIG. 1, where the metal capping layer 312 and the barrier layer 314 are formed. Alternatively, the treatment process may be performed in a processing chamber with a dielectric capping layer 320 later to be formed on the treated layer 318 as needed.

In one embodiment, the treatment process may be performed by using a treatment gas mixture to form a plasma in a processing environment to plasma treat the surfaces 316 of the barrier layer 314. The treatment process incorporate desired atoms, such as nitrogen atoms, into the upper portion of the barrier layer 314, densifying the surface 316 of the barrier layer 314, forming the densified treated layer 318, thereby efficiently increasing the moisture resistivity of the barrier layer 314 and reducing the likelihood of oxidation when exposed to air.

In one embodiment, the treatment gas mixture includes at least one of a hydrogen containing gas, a nitrogen containing gas, or an inert gas. In one example, a nitrogen containing gas is utilized to treat the barrier layer 314. Suitable examples of the nitrogen containing gas include $N_2$, $N_2O$, $NO_2$, $NH_3$ and the like. Suitable examples of the inert gas supplied with the treatment gas mixture include at least one of Ar, He, Kr, and the like. Suitable examples of the hydrogen containing gas supplied into the processing chamber 100 include at least one of $H_2$, $H_2O$, and the like.

In an exemplary embodiment, the nitrogen containing gas supplied in the treatment gas mixture is $N_2$ gas with a flow rate between about 50 sccm and about 1000 sccm.

During the plasma treatment process, several process parameters may be regulated to control the treatment process. In one exemplary embodiment, a process pressure is regulated between about 10 mTorr to about 5000 mTorr, such as between about 400 mTorr and about 2000 mTorr. A RF bias power at a frequency of about 13 MHz may be applied to maintain a plasma in the treatment gas mixture. For example, a RF bias power of about 100 Watts to about 1000 Watts may be applied to maintain a plasma inside the processing chamber 100. A RF source power at a frequency of about 13.56 MHz may be applied to maintain a plasma in the treatment gas mixture. A substrate temperature is maintained between about 25 degrees Celsius to about 400 degrees Celsius, such as between about 25 degrees Celsius and about 250 degrees Celsius.

In one embodiment, the substrate 300 is subjected to the treatment process for between about 5 seconds to about 5 minutes, depending on the operating temperature, pressure and flow rate of the gas. For example, the substrate can be exposed to the pretreatment processes for about 30 seconds to about 90 seconds. In an exemplary embodiment, the substrate is exposed to the treatment process for about 90 seconds or less.

After the treated layer 318 is formed on the substrate 300, a dielectric capping layer 320 is then formed on the treated layer 318, as shown in FIG. 3C. The dielectric capping layer 320 may be a dielectric layer with low dielectric constant, such as low dielectric constant less than 4.0 (e.g., a low-k material). In one embodiment, the dielectric capping layer 320 may be a carbon-containing silicon oxides (SiOC), such as BLACK DIAMOND® dielectric material available from Applied Materials, Inc. Alternatively, the dielectric capping layer 320 may be any suitable dielectric materials, polymer materials, such as polyamides, SOG, or the like. In one embodiment, the dielectric capping layer 320 may be a SiOC layer with a thickness between about 10 Å and about 200 Å.

Figure 4:
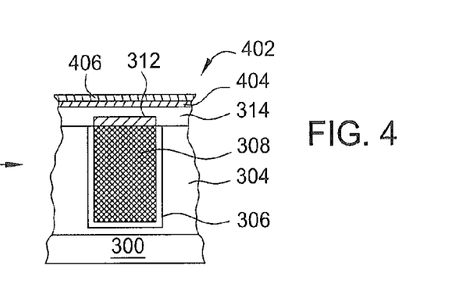
FIG. 4 depicts a cross-sectional view of a passivation protection structure disposed on a semiconductor substrate over a sequence processing steps after a metal line is exposed in accordance with one embodiment of the present invention.

FIG. 4 depicts another embodiment for forming an interconnection structure 402 with desired passivation protection. Similarly, the substrate 300 may have the barrier layer 314 formed thereon, as shown in FIG. 3A. Subsequently, a dielectric initiation layer 404 is formed on the barrier layer 314, as shown in FIG. 4. In this particular embodiment, the dielectric initiation layer 404 is utilized to be formed on the barrier layer 314, rather than a treatment process as performed to form the treated layer 318 on the barrier layer 314. The dielectric initiation layer 404 may be formed along with a dielectric capping layer 406, similar to the dielectric capping layer 320 as shown in FIG. 3C, subsequently formed thereon in a single process chamber without breaking vacuum or exposure to air, so as to minimize oxidation to the barrier layer 314.

In one embodiment, the dielectric initiation layer 404 may be selected from a material that may assist bridging the barrier layer 314 and the dielectric capping layer 406. The dielectric initiation layer 404 may assist interface adhesion between the barrier layer 314 and the dielectric capping layer 406, without undesired crack or peeling. The dielectric initiation layer 404 is desired to be formed as a thin layer so as to maintain good interconnection integrity without altering the conductivity, resistivity and capacitance of the overall interconnection structures 402. In one embodiment, the dielectric initiation layer 404 is an oxygen free dielectric layer so as to maintain good contact resistivity to the barrier layer 314.

In one embodiment, the dielectric initiation layer 404 is a silicon nitride containing layer or a silicon carbide containing layer. In one example, the dielectric initiation layer 404 is a silicon nitride layer or a silicon carbon nitride (SiCN) with a thickness between about 5 Å and about 20 Å, such as about 10 Å. The dielectric initiation layer 404 may be formed by a CVD process, an ALD process or any suitable deposition techniques in a PVD, CVD, ALD, or other suitable plasma processing chambers.

The dielectric capping layer 406 is similar to the dielectric capping layer 320 made by a dielectric layer with low dielectric constant, such as low dielectric constant less than 4.0 (e.g., a low-k material). In one embodiment, the dielectric capping layer 406 may be a carbon-containing silicon oxides (SiOC), such as BLACK DIAMOND® dielectric material available from Applied Materials, Inc. Alternatively, the dielectric capping layer 406 may be any suitable dielectric materials, polymer materials, such as polyamides, SOG, or the like.

Figure 5:
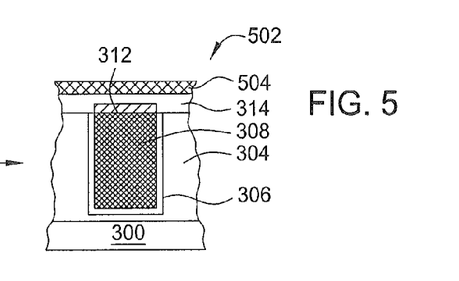
FIG. 5 depicts a cross-sectional view of a passivation protection structure disposed on a semiconductor substrate over a sequence processing steps after a metal line is exposed in accordance with one embodiment of the present invention.

FIG. 5 depicts yet another embodiment for forming an interconnection structure 502 with desired passivation protection. Similarly, the substrate 300 may have the barrier layer 314 formed thereon, as shown in FIG. 3A. Subsequently, an oxygen free dielectric capping layer 504 may then be formed on the barrier layer 314. The oxygen free dielectric capping layer 504 is selected to form on the barrier layer 314 with minimum impact on the contact resistivity to the barrier layer 314. It is believed that excess oxygen formed in the film layer with barrier layer 314, a metal dielectric layer, may inevitably and undesirably increase the contact resistivity between the metal dielectric layer and the oxygen free dielectric capping layer 504, thereby undesirably impacting on the electrical properties of the interconnection structure 502.

In one embodiment, the oxygen free dielectric capping layer 504 is a silicon carbide (SiC) material or a silicon nitride (SiN) material. In one embodiment, the oxygen free dielectric capping layer 504 is a SiC layer with a thickness between about 5 Å and about 20 Å, such as about 10 Å. The oxygen free dielectric capping layer 504 may be formed by a CVD process, an ALD process or any suitable deposition techniques in a PVD, CVD, ALD, or any suitable plasma processing chambers.

Figure 6A:
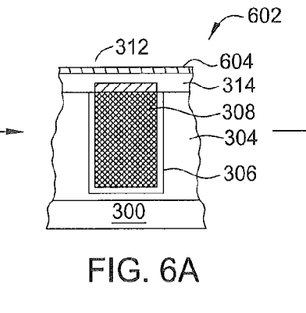
FIGS. 6A-6B depict a cross-sectional view of a passivation protection structure disposed on a semiconductor substrate over a sequence processing steps after a metal line is exposed in accordance with one embodiment of the present invention.
Figure 6B:
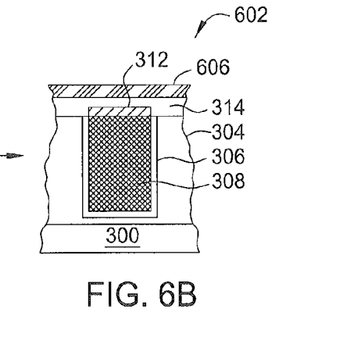

FIGS. 6A-6B depicts yet another embodiment for forming an interconnection structure 602 with desired passivation protection. Similarly, the substrate 300 may have the barrier layer 314 formed thereon, as shown in FIG. 3A. After the barrier layer 314 is formed on the substrate 300, an oxidation process is then performed to form an oxidation layer 604 on the barrier layer 314, as shown in FIG. 6A. The oxidation process is performed to incorporate oxygen atoms into the barrier layer 314 to alter the surface properties and convert the upper portion of the barrier layer 314 to form the oxygen containing metal dielectric layer. In the embodiment wherein the barrier layer 314 is an aluminum nitride (AlN) layer, the oxidation process as performed may convert an upper portion of the barrier layer 314 into the oxidation layer 604, such as an aluminum oxynitride (AlON) layer. As such, the barrier layer 314 may become an AlON layer having a thicker thickness with an upper portion, the oxidation layer 604, comprising an oxygen-rich aluminum nitride (AlN) layer, such as an aluminum oxynitride (AlON) layer formed on the barrier layer 314.

Subsequently, after the oxidation layer 604 is formed on the barrier layer 314, a replacement/modification process is then performed to replace the oxygen atoms incorporated into the oxidation layer 604, e.g., upper portion of the barrier layer 314, out of the barrier layer 314 so as to provide space to incorporate another element thereto instead. In one embodiment, a dielectric capping layer 606 may be formed on the substrate 300 to replace/convert the oxidation layer 604 into the dielectric capping layer 606, as shown in FIG. 6B. As the dielectric capping layer 606 is selected to be an oxygen containing layer, the oxygen atoms from the oxidation layer 604 tend to bridge with the atoms from the dielectric capping layer 606, providing a strong interface bonding network between the dielectric capping layer 606 and the barrier layer 314. It is believed that the oxidation process as performed to form the sacrificial oxidation layer 604 may assist driving the existing atoms (aluminum and/or nitride atoms) from the underlying barrier layer 314 to move downward in a more close-packed manner so as to allow more interstitial sites for the oxygen atoms to be incorporated thereto, thereby densifying the film property of the underlying barrier layer 314. Once the upper oxidation layer 604 is removed and converted to be part of the dielectric capping layer 606, the remaining densified and close-packed barrier layer 314 may provide a good interface passivation property to the underlying metal layer 308 and the metal capping layer 312 without degrading the conductivity at the interface.

In one embodiment, the oxidation layer may be formed by exposing the barrier layer 314 to an oxygen containing gas selected from at least one of CO, $CO_2$, $O_2$, $NO_2$, NO, $N_2O$, $O_3$, or $H_2O$. A plasma process may be performed to use plasma to dissociate the oxygen containing into oxygen ions, charges and oxygen active species. The oxygen atoms from the oxygen ions, charges or oxygen active species may then later react with the silicon and/or carbon atoms from a silicon and carbon containing gas to form the desired dielectric capping layer 606, such as a SiOC layer. Suitable examples for the silicon and carbon containing gas includes TMS, or the combination of silane and carbon oxide.

In one embodiment, the dielectric capping layer 606 subsequently formed thereon may be a dielectric layer, similar to the dielectric capping layer 504, 404, 320 discussed above with low dielectric constant, such as low dielectric constant less than 4.0 (e.g., a low-k material). In one embodiment, the dielectric capping layer 606 may be a carbon-containing silicon oxides (SiOC), such as BLACK DIAMOND® dielectric material available from Applied Materials, Inc. alternatively, the dielectric capping layer 606 may be any suitable dielectric materials, polymer materials, such as polyamides, SOG, or the like. In one embodiment, the dielectric capping layer 606 is a SiOC layer with a thickness between about 10 Å and about 200 Å.

It is noted that the oxidation layer 604 may be partly or completely removed or converted to be part of the dielectric capping layer 606. In another embodiment, there may be a thickness less than about 10 Å of the oxidation layer 604 remaining on the barrier layer 314 on which the dielectric capping layer 606 is subsequently formed.

In one embodiment, the oxidation layer 604 may be formed within the same chamber that the dielectric capping layer 606 is formed. Alternatively, the oxidation layer 604 may be formed within the same chamber that the barrier layer 314 is formed. Additionally, the barrier layer 314, the oxidation layer, and the dielectric capping layer 606 may be all formed individually in different chambers, the same chambers, or in any suitable arrangement as needed.

In one embodiment, the oxidation layer 604 has a thickness between about 5 Å and about 30 Å after formation of the dielectric capping layer 606. The oxidation layer 604 may be formed by a CVD process, an ALD process or any suitable deposition techniques in a PVD, CVD, ALD, or any suitable plasma processing chambers. In one embodiment, the dielectric capping layer 606 has a thickness between about 10 Å and about 200 Å. The dielectric capping layer 606 may be formed by a CVD process, an ALD process or any suitable deposition techniques in a PVD, CVD, ALD, or any suitable plasma processing chambers.

It is noted that the metal capping layer 312, the barrier layer 314, the treated layer 318 and the dielectric capping layer 320 in the interconnection structure 302 may be in-situ deposited and completed in one processing chamber, or ex-situ deposited in different processing chambers of a multi-chamber processing system as needed. The metal capping layer 312, the barrier layer 314, the dielectric initiation layer 404 and the dielectric capping layer 406 in the interconnection structure 402 may be in-situ deposited and completed in one processing chamber, or ex-situ deposited in different processing chambers of a multi-chamber processing system as needed. The metal capping layer 312, the barrier layer 314, and the oxygen free dielectric capping layer 504 in the interconnection structure 502 may be in-situ deposited and completed in one processing chamber, or ex-situ deposited in different processing chambers of a multi-chamber processing system as needed. The metal capping layer 312, the barrier layer 314, the oxidation layer 604, and the dielectric capping layer 606 in the interconnection structure 602 may be in-situ deposited and completed in one processing chamber, or ex-situ deposited in different processing chambers as needed.

Thus, a method and an apparatus for forming a passivation protection for a metal line in an interconnection structure are provided. The barrier layer formed on the metal line may efficiently protect the metal line from exposure to the atmosphere, thereby eliminating likelihood of native oxide formation or contamination, maintaining a good interface control. By utilizing a proper passivation protection formed on a metal line, the metal line may be controlled with minimum oxide or contamination generation, thereby increasing manufacturing flexibility without degradation of device performance.

While the foregoing is directed to embodiments of the present invention, other and further embodiments of the invention can be devised without departing from the basic scope thereof, and the scope thereof is determined by the claims that follow.

The invention claimed is:

1. A method for forming passivation protection on a metal line in an interconnection structure for semiconductor devices, comprising:
  selectively forming a metal capping layer on a metal line bounded by a dielectric bulk insulating layer in an interconnection structure formed on a substrate in a processing chamber incorporated in a multi-chamber processing system;
  in-situ forming a barrier layer on the substrate in the processing chamber; wherein the barrier layer is a metal dielectric layer; and
  forming a dielectric capping layer on the barrier layer in the multi-chamber processing system, wherein the dielectric capping layer is a low dielectric constant material having a dielectric constant less than 4.

2. The method of claim 1, wherein the dielectric capping layer is formed in another processing chamber incorporated in the multi-chamber processing system.

3. The method of claim 1, further comprising:
  treating the barrier layer to form a treated layer thereon prior to forming the dielectric capping layer.

4. The method of claim 3, wherein treating the barrier layer further comprises:
  treating the barrier layer with a nitrogen containing gas.

5. The method of claim 1, further comprising:
  forming a dielectric initiation layer on the barrier layer prior to forming the dielectric capping layer.

6. The method of claim 5, wherein forming the dielectric initiation layer further comprising:
  forming an oxygen free dielectric layer.

7. The method of claim 6, wherein the dielectric initiation layer is a silicon nitride layer or a silicon carbide layer.

8. The method of claim 1, wherein the dielectric capping layer is a oxygen free dielectric layer.

9. The method of claim 8, wherein the oxygen free dielectric layer is a silicon carbide (SiC) layer or a silicon nitride (SiN) layer.

10. The method of claim 1, further comprising:
  forming an oxidization layer on the barrier layer prior to forming the dielectric capping layer.

11. The method of claim 10, wherein forming an oxidization layer further comprising:
  forming the oxidization layer by treating the barrier layer with an oxygen containing gas.

12. The method of claim 11, wherein the oxygen containing gas includes at least one of $CO$, $CO_2$, $O_2$, $NO_2$, $NO$, $N_2O$, $O_3$ and $H_2O$.

13. The method of claim 10, further comprising:
  converting the oxidation layer into a portion of the dielectric capping layer while forming the dielectric capping layer.

14. The method of claim 13, wherein converting the oxidation layer further comprising:
  reacting oxygen atoms from the oxidation layer with atoms from a gas mixture used to form the dielectric capping layer.

15. The method of claim 14, wherein atoms are silicon and carbon atoms supplied from a silicon and carbon containing gas supplied in the gas mixture.

16. The method of claim 13, wherein the dielectric capping layer is a SiOC layer.

17. The method of claim 1, wherein the barrier layer is fabricated from at least one of AlN, $AlO_3$, or AlON.

18. The method of claim 1, wherein the dielectric capping layer is a low k material having a dielectric constant less than 4.

19. The method of claim 1, wherein the metal capping layer is at least one of cobalt containing materials, tungsten containing materials, nickel containing materials, aluminum containing materials, ruthenium containing materials, or manganese containing materials.

20. A method for forming passivation protection on a metal line in an interconnection structure for semiconductor devices, comprising:
  selectively forming a metal capping layer on a metal line bounded by a dielectric bulk insulating layer in an interconnection structure formed on a substrate in a PVD processing chamber;
  in-situ forming a barrier layer on the substrate in the PVD processing chamber; wherein the barrier layer is a metal dielectric layer; and
  forming a dielectric capping layer on the barrier layer, wherein the dielectric capping layer is a SiOC layer.

* * * * *